United States Patent
Ma et al.

(10) Patent No.: US 7,435,124 B2
(45) Date of Patent: Oct. 14, 2008

(54) LAND GRID ARRAY SOCKET

(75) Inventors: Hao-Yun Ma, Tu-Cheng (TW);
Chi-Nan Liao, Tu-Cheng (TW);
Yu-Chen Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,245

(22) Filed: Jun. 5, 2007

(65) Prior Publication Data

US 2007/0281533 A1 Dec. 6, 2007

(30) Foreign Application Priority Data

Jun. 5, 2006 (TW) .............................. 95209732 U

(51) Int. Cl.
*H01R 13/62* (2006.01)
(52) U.S. Cl. ......................................... 439/331; 439/73
(58) Field of Classification Search .................. 439/331, 439/330, 342, 73, 525, 526
See application file for complete search history.

(56) References Cited

U.S. PATENT DOCUMENTS

| 7,025,603 | B2* | 4/2006 | Ma .............................. 439/73 |
| 7,252,517 | B2* | 8/2007 | Ju ................................ 439/73 |
| 2005/0090136 | A1* | 4/2005 | Liao et al. ................... 439/331 |
| 2005/0233628 | A1* | 10/2005 | Yang et al. .................. 439/331 |
| 2006/0057878 | A1* | 3/2006 | Szu ............................ 439/331 |
| 2006/0105608 | A1* | 5/2006 | Ma ............................ 439/331 |
| 2006/0178031 | A1* | 8/2006 | Lai ............................ 439/331 |

* cited by examiner

*Primary Examiner*—Hien Vu
(74) *Attorney, Agent, or Firm*—Wei Te Chung

(57) ABSTRACT

A land grid array socket (12) includes a dielectric housing (30) and a number of conductive terminals (40) secured thereto. A stiffener (50) having a pair of transverse flanges (504, 508) and a pair of discrete longitudinal sidewall (506) is disposed around the housing. A load plate (60) is pivotally attached to one of the flange for downwardly pressing a land grid array package seated on the terminals toward the housing. A lever (70) is moveably coupled to the other flange for locking the load plate in position.

3 Claims, 5 Drawing Sheets

LAND GRID ARRAY SOCKET

BACKGROUND OF THE INVENTION

1. Field of the Invention

The present invention generally relates to the art of electrical connectors. And more particularly, one embodiment of the present invention relates to a land grid array socket for forming electrical connection between a land grid array package and a circuit substrate.

2. General Background

Land grid array sockets are widely used in various electronic devices to form electrical connection between two separate electrical interfaces, such as a land grid array package and a circuit substrate, due to reliable electrical performance.

Referring to FIG. 5, a relevant prior land grid array socket 1 typically includes a dielectric housing 2 and a number of conductive terminals 3 secured therein, a stiffener 4 disposed around the housing 2, a load plate 5 having a pair of opposing bent sections 50 pivotally supported on the stiffener 4 and rotatable relative thereto between an opening position and a closed position, and a lever 6 moveably coupled to the stiffener 4 to lock the load plate 5 in position.

The stiffener 4 includes a pair of opposing flanges 40, 42 extending upwardly from two transverse sides thereof and a pair of longitudinally continuous sidewalls 44 joining the two flanges 40, 42, so as to accommodate the bent sections 50 of the stiffener 4 therebetween.

However, in the prior design, when the load plate 5 is oriented to the closed position, the continuous sidewalls 44 of the stiffener 4 are situated at outer sides of the load plate 5 to supply adequate room for receiving the bent sections 50 of the load plate 5, which may considerably occupy valuable real estate of the circuit substrate (not shown) on which the land grid array socket 1 is mounted. During operation of the land grid array socket 1, the sidewalls 44 may potentially interfere with other electronic components on the circuit substrate.

Additionally, as well known in the art, during the course of assembly, the land grid array socket 1 is transported to and positioned on the circuit substrate via a vacuum suction device. The continuous sidewalls 44 of the stiffener 4 will considerably increase the whole weight of the land grid array socket 1. Consequently, during transport, the land grid array socket 1 is possibly at the risk of disengaging from the vacuum suction device, which may adversely affect the efficiency of transporting the land grid array socket 1.

Therefore, there is a heretofore unaddressed need in the industry to address the aforementioned deficiencies and inadequacies.

SUMMARY

According to one embodiment of the present invention, a land grid array socket includes a dielectric housing and a number of conductive terminals secured thereto. A stiffener having a pair of discrete sidewalls is engagingly disposed around the housing. A load plate is pivotally supported on one side of the stiffener for downwardly pressing a land grid array package seated on the conductive terminals toward the housing. A lever is moveably coupled to another side of the stiffener for locking the load plate in position.

The stiffener of the land grid array socket in accordance with the embodiment of the present invention includes a pair of discrete sidewalls. The arrangement of the discrete sidewalls can reduce the weight and size of the land grid array socket, which can prevent the land grid array socket from disengaging from a vacuum suction device attached thereto.

The present invention is illustrated by way of example and not limitation in the figures of the appended drawings, in which like references indicate identical elements, and in which:

DETAILED DESCRIPTION OF THE EMBODIMENTS

In the following description, for purpose of explanation, numerous details are set forth in order to provide a thorough understanding of the embodiments of the present invention. However, it will be apparent to one skilled in the art that these specific details are not required in order to practice the embodiments of the present invention.

Figure 1:
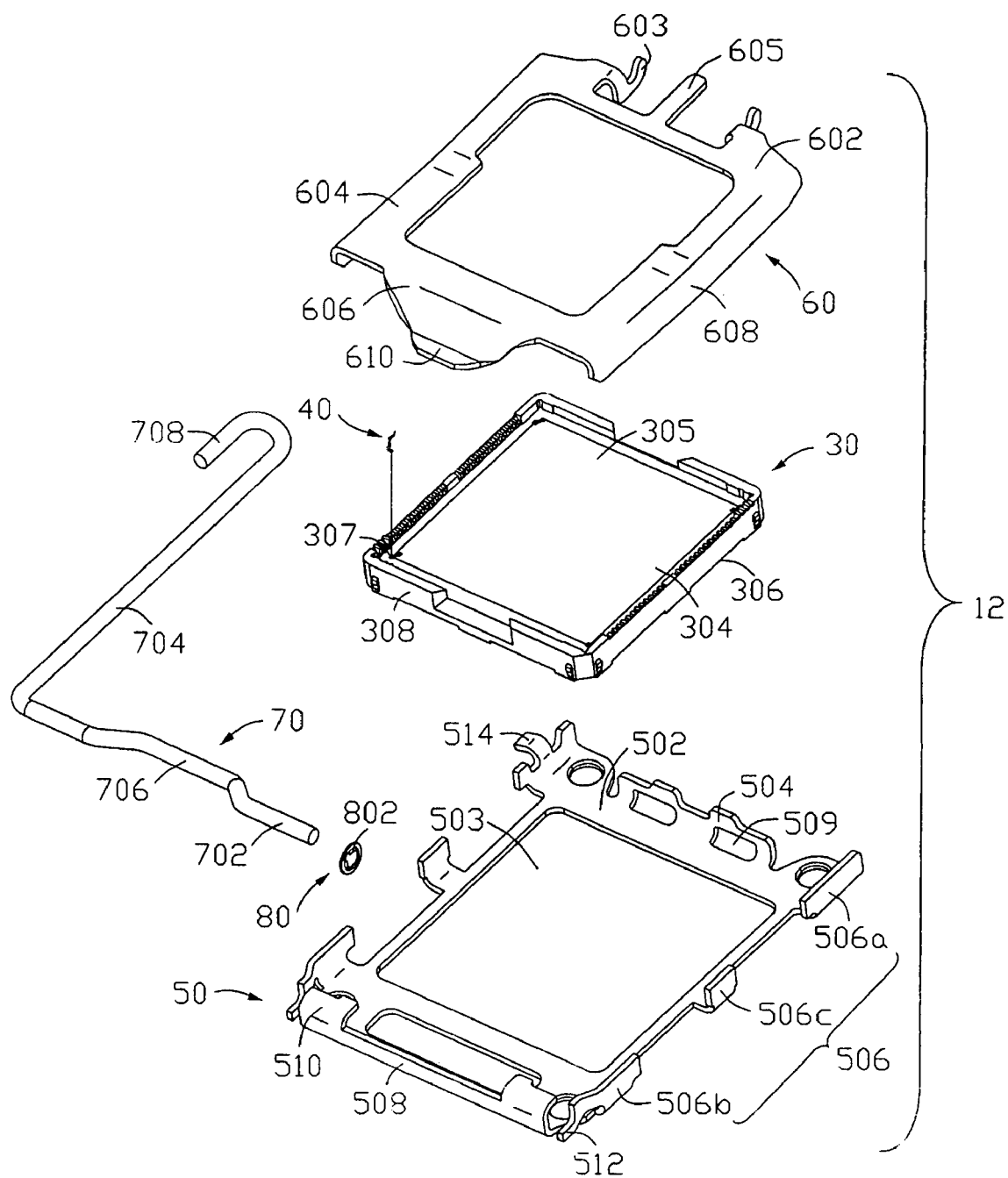
FIG. 1 depicts an exemplary perspective, exploded view of a land grid array socket according to a first embodiment of the present invention.
Figure 2:
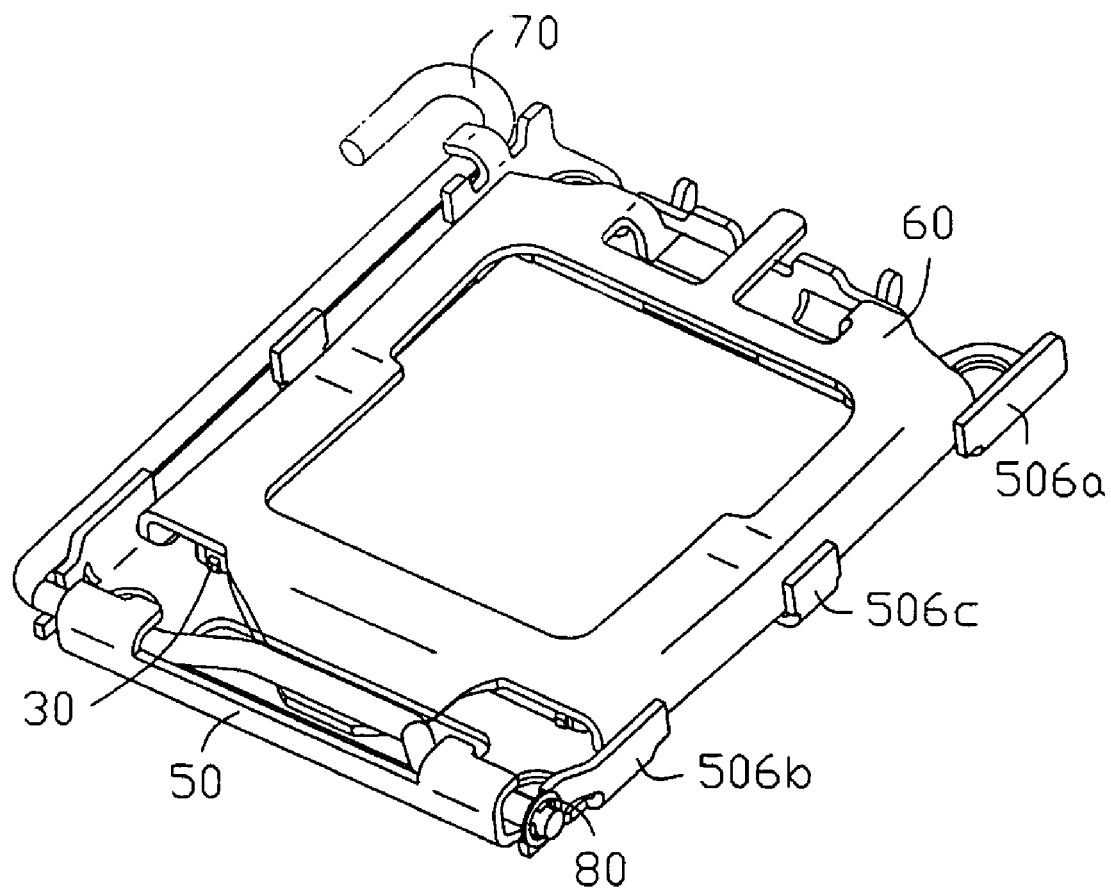
FIG. 2 depicts an exemplary perspective, assembled view of the land grid array socket shown in FIG. 2.

Referring to FIG. 1 and FIG. 2, a land grid array socket 12 according to a first embodiment of the present invention is provided to form electrical connection between a land grid array package (not shown) and a circuit substrate (not shown). The land grid array socket 12 includes a dielectric housing 30 and a number of conductive terminals 40 retained in the housing 30. A stiffener 50 having a pair of transversely oriented flanges 504, 508 and a pair of longitudinally oriented discrete sidewalls 560 is disposed around the housing 30. A load plate 60 is pivotally attached to one of the flanges 504 for downwardly pressing the land grid array package seated on the terminals 40 toward the housing 30. A lever 70 is moveably coupled to the other flange 508 for locking the load plate 60 in position.

Individual elements of the land grid array socket 12 will now be described in detail. Referring to FIG. 1, the housing 30 is generally a rectangular configuration made from resin or the like. The housing 30 includes an electrical area 304 at a center thereof and a number of flat walls 308 rising upwardly and vertically from an outer periphery of the electrical area 304. The electrical area 304 includes a top surface 305 to receive the land grid array package thereon, an opposite bottom surface 306 mountable on the circuit substrate, and a number of passage 307 extending from the bottom surface 306 toward the top surface 305.

A number of conductive terminals 40 are secured in corresponding passages 307, respectively. Each terminal 40 includes an upper resilient arm (not labeled) sticking out of the top surface 305 of the housing 30 to mechanically and electrically mate with a bottom interface of the land grid array package, and a lower soldering bad (not labeled) to be electrically mounted on the circuit substrate via a soldering mass (not shown) attached thereto.

Referring also to FIG. 2, the stiffener 50 is formed via stamping and bending a single sheet of metallic material, such as steel or the like, into a rectangular hollow frame. The stiffener 50 includes a flat bottom wall 502 defining a rectangular aperture 503 at a center thereof. A pair of transversely oriented flanges 504, 508 rise upwardly from two opposing edges of the bottom wall 502. One of the flanges 504 defines a pair of slots 509. The other flange 508 is formed with a pair of tabs 510 spaced apart from each other. The tabs 510 and the bottom wall 502 cooperatively enclose a receiving chamber (not labeled) to accommodate the lever 70 therein.

Disposed between the two flanges 504, 508 is a pair of longitudinally oriented discrete sidewalls 506. Each sidewall 506 includes three discrete blocks, i.e. 506a, 506b, 506c, spaced apart from and aligned with each other. The blocks close to the flange 508, namely 506b, each form a curved rib 512 extending longitudinally toward the flange 508. The ribs 512 can pivotally support the lever 70 thereon as well as allow the lever 70 to rotate relative to the stiffener 50 in the receiving chamber. One of the blocks proximal to the flange 508, namely 506a, is formed with an arched hook 514 to hold the lever 70 in position.

The load plate 60 is also a hollow frame stamped and bent from a single sheet of metallic material, such as steel or the like. The load plate 60 includes a connecting edge 602, a pressing edge 606 opposite to the connecting edge 602, and a pair of lateral edges 604 joining the connecting edge 602 to the pressing edge 606. The connecting edge 602 is formed with a strip-shaped stopper 605 in a middle thereof and a pair of latches 603 symmetrically arranged at two sides of the stopper 605. The stopper 605 can prevent the load plate 60 from overly rotating with respect to the stiffener 50 and further striking the circuit substrate. A smooth curved tongue 610 extends upwardly and obliquely from the pressing edge 606. The tongue 610 can engage with the lever 70 so as to lock the load plate 60 in position. Each of the lateral edges 604 is configured to have a bent section 608 extending downwardly toward the bottom wall 502 of the stiffener 50.

The lever 70 is stamped and bent from a single metallic rod. The lever 70 includes a shaft 702 to be supported on the ribs 512 of the stiffener 50 and an operating arm 704 extending perpendicularly from a distal end of the shaft 702. The shaft 702 includes an axially offset pressing section 706 at a middle thereof to clip the tongue 610 of the load plate 60. The operating arm 704 includes a U-shaped handle 708 extending outwardly and angularly from a distal end of the operating arm 704 for facilitating the operation of the lever 70.

The assembly of the land grid array socket 12 will now be described in more detail. Referring to FIG. 2, the load plate 60 is pivotally attached to the flange 504 of the stiffener 50, with the latches 603 being compliantly inserted in corresponding slots 509, respectively. The lever 70 is pivotally settled on the ribs 512 of the sidewall 506 and rotatable in the receiving chamber freely. The load plate 60 and the lever 70 are both manually rotated afar from the stiffener 50 to the opening position. The housing 40 secured with the terminals 40 compliantly resides in the aperture 503. As an alternative form of the present embodiment, a blocking ring 80 is preferably fitted around one end of the shaft 702 of the lever 70 to prevent the lever 70 from popping out of the receiving chamber.

The operation of the land grid array socket 12 will now be described in more detail. Prior to placing the land grid array package on the land grid array socket 12, the land grid array socket 12 is electrically connected to the circuit substrate via the soldering mass attached to the terminal 40. The load plate 60 and the lever 70 are manually rotate with respect to the stiffener 50 to the opening position. The land grid array package is set on the terminals 40. The load plate 60 is driven to rotate around the flange 504 of the stiffener 50 until the bottom surface thereof press firmly against a top surface of the land grid array package. The lever 70 is urged to rotate about the flange 508 to mate with the tongue 610 of the load plate 60 as well as downwardly press the land grid array package seated on the terminals 40 toward the housing 30. When the load plate 60 is oriented to the closed position, the operation arm 704 of the lever 70 is held under the hook 514 of the stiffener 50. The bent sections 608 of the load plate 60 are located between the two opposing discrete sidewalls 506.

In connection with the preceding description, the stiffener 50 of the land grid array socket 12 in accordance with the embodiment of the present invention includes a pair of discrete sidewalls 506. The arrangement of the discrete sidewalls 506 can reduce the weight and size of the land grid array socket 12, which can stop the land grid array socket 12 from disengaging from a vacuum suction device attached thereto.

Figure 3:
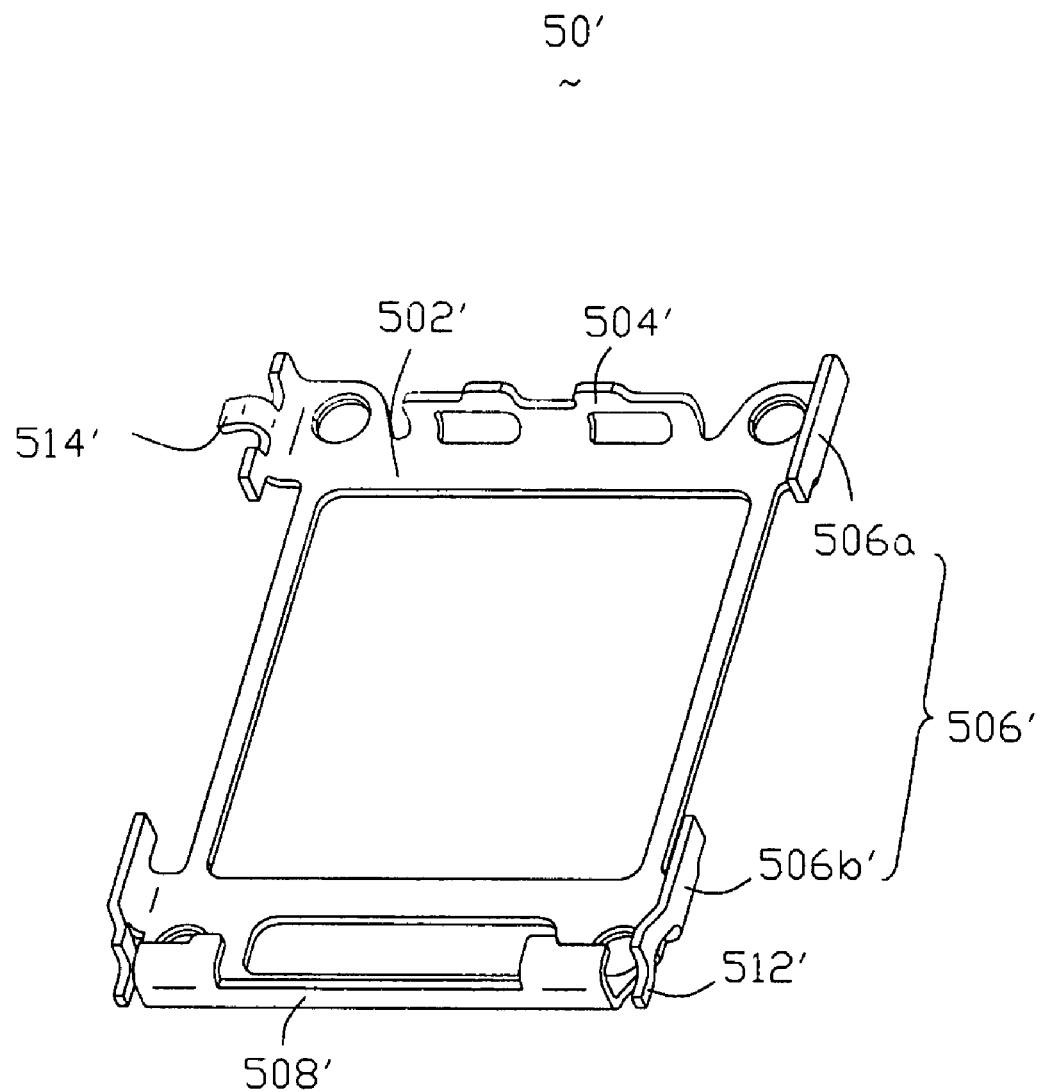
FIG. 3 depicts an exemplary perspective view of a stiffener for a land grid array socket according to a second embodiment of the present invention.

FIG. 3 depicts a stiffener 50' for a land grid array socket according to a second embodiment of the present invention. The stiffener 50' includes a flat bottom wall 502' and a pair of transversely oriented flanges 504', 508' bent upwardly from two opposing sides of the bottom wall 502'. Disposed between the two flanges 504', 508' is a pair of longitudinally oriented discrete sidewalls 506'. Each sidewall 506' includes a pair of discrete blocks, i.e. 506a' and 506b' spaced apart from and aligned with each other. The blocks close to the flange 508', namely 506b', each form a curved rib 512' extending longitudinally toward the flange 508' to pivotally support the lever 70 thereon. One of the blocks proximal to the other flange 504', namely 506a' is provided with an arched hook 514' to lock the lever 70 in position.

Figure 4:
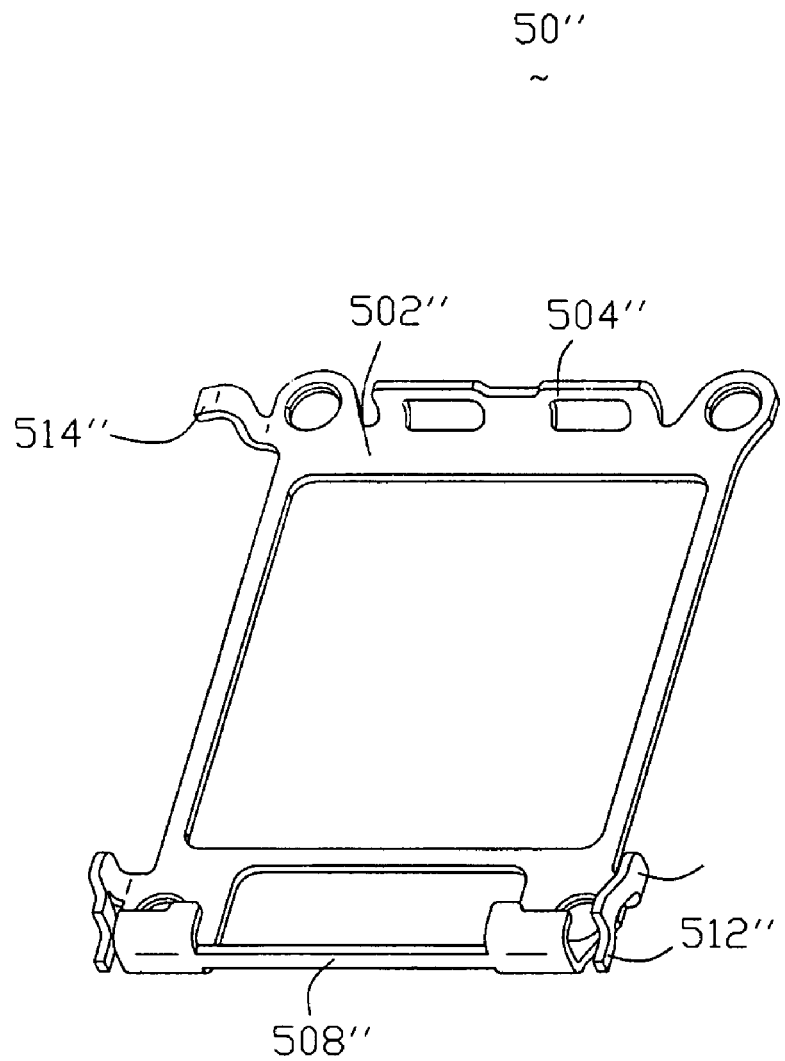
FIG. 4 depicts an exemplary perspective view of a stiffener for a land grid array socket according to a third embodiment of the present invention.
Figure 5:
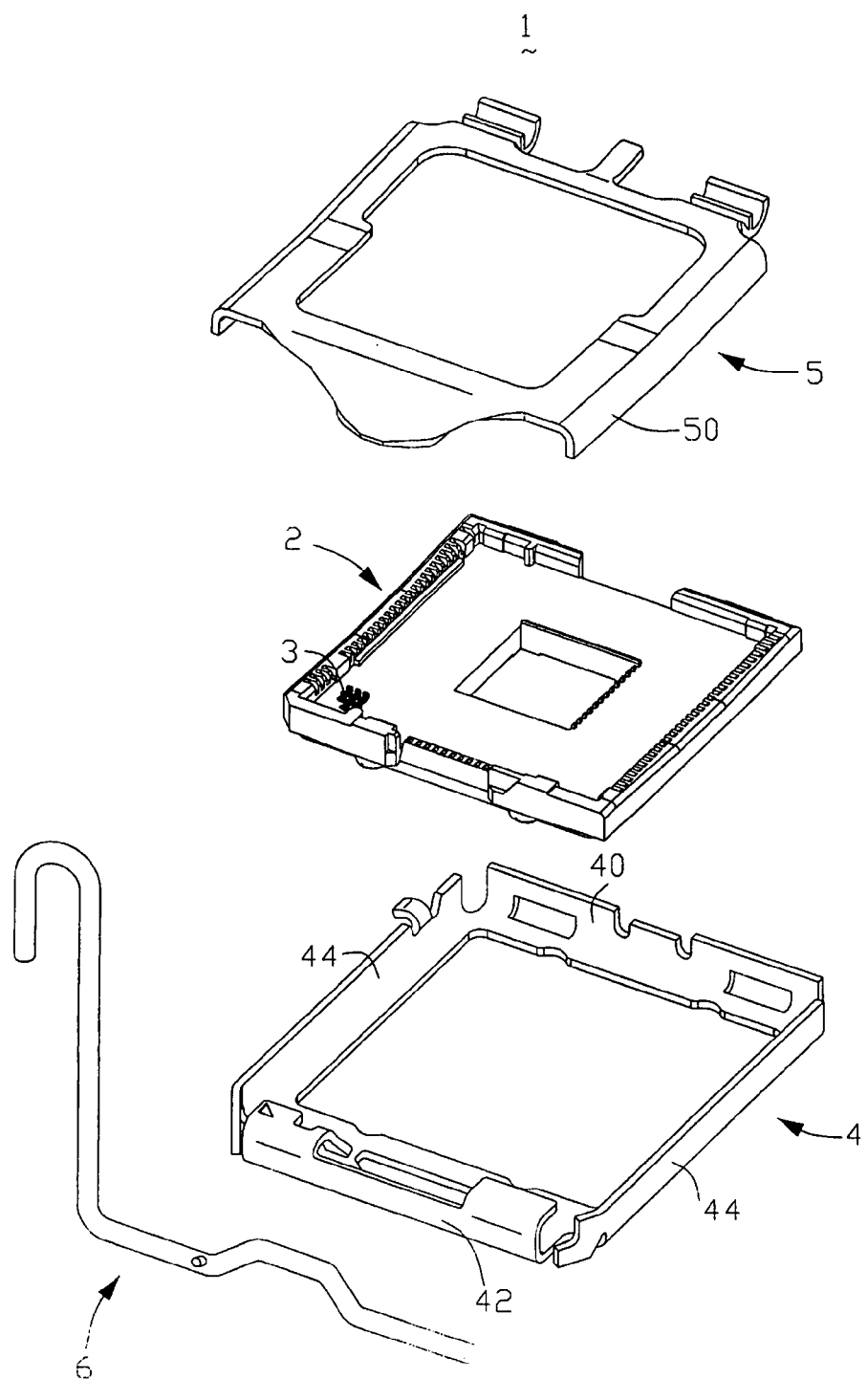
FIG. 5 depicts an exemplary perspective, exploded view of a land grid array socket in accordance with a prior design.

FIG. 4 depicts a stiffener 50" for a land grid array socket in accordance with a third embodiment of the present invention. The stiffener 50" includes a flat bottom wall 502" and a pair of transverse flanges 504", 508" bent upwardly from two opposing sides of the bottom wall 502'. A pair of ribs 506" extending longitudinally toward one of the flange 508" is bent upwardly from the bottom wall 502". The ribs 506" are proximal to the flange 508" and can pivotally support the lever 70 thereon. A curved hook 514" close to the other flange 504" is integrally formed with the bottom wall 502" to hold the lever 70 in position.

It should be understood that, as well known in the art, the stiffeners 50', 50" in accordance with the second and the embodiments of the present invention can also be coupled to the housing 30, the load plate 50 and the lever 70 in a manner similar to that of the stiffener 50 according to the first embodiment of the present invention.

It should be noted that when the land grid array socket 12 having a stiffener 50', 50" in accordance with the second and third embodiment of the invention is oriented to the closed position, from a top view, the bent sections 608 of the load plate 60 are located substantially at two outer sides of the bottom wall 502', 502", which can save valuable space of the circuit substrate.

While the present invention has been illustrated by description of embodiments thereof, and while the embodiments have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

The invention claimed is:

1. A land grid array socket comprising:
a dielectric housing having a top surface and a bottom surface with a plurality of passages extending from the bottom surface toward the top surface;
a plurality of conductive terminals secured to corresponding passages, respectively;
a metallic stiffener disposed beside the housing, the stiffener having a pair of transversely oriented flanges, one of the flanges having a center groove and a pair of longitudinally oriented discrete sidewalls rising upwardly from a periphery of a bottom wall thereof, and each of the sidewalls formed by at lest two discontinued end blocks respectively adjacent to the flanges;
a metal load plate pivotally attached to one of the transverse flanges for downwardly pressing a land grid array package seated on the conductive terminals toward the housing wherein one edge of the load plate has a stopper extended outwardly and to be positioned in the groove; and
a lever moveably coupled to the other transverse flange for locking the load plate in position;
wherein one of the blocks is formed with an arched hook to hold the lever;
wherein the load plate comprises a pair of bent sections extending downwardly from two edges thereof, when the load plate is oriented to the closed position, the bent sections are located between the two opposing discrete sidewalls.

2. The land grid array socket of claim 1, wherein a blocking ring is fitted around a distal end of the lever.

3. A land grid array socket comprising:
a dielectric housing having a top surface and a bottom surface with a plurality of passages extending from the bottom surface toward the top surface;
a plurality of conductive terminals secured to corresponding passages, respectively;
a metallic stiffener surrounding the housing and having a pair of transversely oriented flanges one of the flanges having a center groove along a transverse direction and a pair of longitudinally oriented discrete sidewalls each of the sidewalls formed with at least two discontinued end blocks respectively adjacent to the flanges, along a longitudinal direction, rising upwardly from a boundary of a bottom wall thereof;
a metal load plate pivotally attached to one of the transverse flanges for downwardly pressing a land grid array package seated on the conductive terminals toward the housing wherein one edge of the load plate has a stopper extended outwardly and to be positioned in the groove; and
a lever moveably coupled to the other transverse flange for locking the load plate in position;
wherein
each of the sidewalls is configured not to extend with a full distance between said pair of flanges but with thereof at least one significant cutout, which fully interrupts each sidewall, for not only reducing a weight of the stiffener but also easing assembling of the lever with regard to the stiffener;
wherein one of the blocks is formed with an arched hook to hold the lever;
wherein the load plate comprises a pair of bent sections extending downwardly from two edges thereof, when the load plate is oriented to the closed position, the bent sections are located between the two opposing discrete sidewalls.

* * * * *